United States Patent
Braun et al.

(10) Patent No.: US 9,054,224 B2
(45) Date of Patent: Jun. 9, 2015

(54) METHOD FOR THE WAFER-LEVEL INTEGRATION OF SHAPE MEMORY ALLOY WIRES

(75) Inventors: Stefan Braun, Reutlingen (DE); Frank Niklaus, Täby (SE); Andreas Fischer, Johanneshov (SE); Henrik Gradin, Sollentuna (SE)

(73) Assignee: SENSEAIR AB, Delsbo (SE)

( * ) Notice: Subject to any disclaimer, the term of this patent is extended or adjusted under 35 U.S.C. 154(b) by 0 days.

(21) Appl. No.: 13/885,257

(22) PCT Filed: Nov. 22, 2011

(86) PCT No.: PCT/SE2011/051404
§ 371 (c)(1),
(2), (4) Date: Jul. 24, 2013

(87) PCT Pub. No.: WO2012/071003
PCT Pub. Date: May 31, 2012

(65) Prior Publication Data
US 2013/0292856 A1    Nov. 7, 2013

(30) Foreign Application Priority Data

Nov. 22, 2010    (SE) .................................. 1001126

(51) Int. Cl.
*H01L 21/44*    (2006.01)
*H01L 23/52*    (2006.01)
(Continued)

(52) U.S. Cl.
CPC ................. *H01L 24/85* (2013.01); *H01L 24/05* (2013.01); *H01L 24/45* (2013.01); *H01L 24/48* (2013.01); *H01L 24/78* (2013.01); *H01L 2224/05571* (2013.01); *H01L 2224/05599* (2013.01); *H01L 2224/78301* (2013.01); *H01L 2224/85345* (2013.01); *H01L 2224/85385* (2013.01); *H01L 2224/85399* (2013.01);
(Continued)

(58) Field of Classification Search
USPC .................. 438/612–614, 666; 257/737, 738, 257/E23.021, E23.069; 228/180.22
See application file for complete search history.

(56) References Cited

U.S. PATENT DOCUMENTS 6,630,738 B2 * 10/2003 Jackson ........................ 257/738
7,442,641 B2 * 10/2008 Beatson et al. ............... 438/667
(Continued)

FOREIGN PATENT DOCUMENTS

EP    2063466 A2    5/2009
JP    6-37132 A    2/1994

OTHER PUBLICATIONS

A.C. Fischer, et al., "Wafer-Level Integration of NITI Shape Memory Alloy Wires for the Fabrication of Microactuators Using Standard Wire Bonding Technology," IEEE 24th International Conference on Micro Electro Mechanical Systems (MEMS 2011), pp. 348-351.
(Continued)

*Primary Examiner* — Jasmine Clark
(74) *Attorney, Agent, or Firm* — Drinker Biddle & Reath LLP

(57) ABSTRACT

The present invention relates to a method to attach a shape memory alloy wire to a substrate, where the wire is mechanically attached into a 3D structure on the substrate. The present invention also relates to a device comprising a shape memory alloy wire attached to a substrate, where the wire is mechanically attached into a 3D structure on the substrate.

20 Claims, 15 Drawing Sheets

(51) Int. Cl.
 *H01L 23/00* (2006.01)
 *B23K 20/00* (2006.01)

(52) U.S. Cl.
 CPC ............ *H01L 2924/01014* (2013.01); *H01L 2924/10253* (2013.01); *B23K 20/007* (2013.01); *H01L 2924/01005* (2013.01); *H01L 2924/01006* (2013.01); *H01L 2924/01023* (2013.01); *H01L 2924/01033* (2013.01); *H01L 2224/858* (2013.01); *H01L 2224/48453* (2013.01); *H01L 2224/45* (2013.01); *H01L 2224/85099* (2013.01); *H01L 2924/01015* (2013.01); *H01L 2924/1461* (2013.01)

(56) References Cited

U.S. PATENT DOCUMENTS 7,750,483 B1 * 7/2010 Lin et al. .................. 257/778
2007/0126091 A1   6/2007 Wood et al.

OTHER PUBLICATIONS

D. Clausi, et al., "Microactuation Utilizing Wafer-Level Integrated SMA Wires," Proceedings of the IEEE International Conference on Micro Electro Mechanical Systems (MEMS)—22nd IEEE International Conference on Micro Electro Mechanical Systems, MEMS 2009, pp. 1067-1070.

* cited by examiner

METHOD FOR THE WAFER-LEVEL INTEGRATION OF SHAPE MEMORY ALLOY WIRES

CROSS REFERENCE TO RELATED APPLICATIONS

This application is a National Stage of International Application No. PCT/SE2011/051404 filed Nov. 22, 2011, and which claims benefit of Swedish Patent Application No. 1001126-0 filed Nov. 22, 2010, both of which are herein incorporated by reference in their entirety.

FIELD OF INVENTION

The present invention relates to a method to attach a shape memory alloy wire to a substrate, and a device comprising a shape memory alloy wire attached to a substrate.

DESCRIPTION OF BACKGROUND ART

Shape memory alloy (SMA) is an attractive actuator material to use in microelectromechanical systems (MEMS) when high forces and work are needed. SMA outperforms most other actuation principles at the microscale by more than an order of magnitude because of the high work density that SMAs offer, see M. Kohl et al.: "Shape memory microactuators", Springer, pp. 23-24, (2004).

Traditionally there are mainly two ways of integrating SMA materials into microsystems. The first approach is a pick and place approach where the SMA material and the microsystem is manufactured separately and then combined in a subsequent step, see K. Skrobanek et al.: "Stress-optimized shape memory microvalves", MEMS Proc., pp. 256-261, (1997). This approach has the advantage of allowing integration of bulk SMA materials, which are commercially available and offered in a wide thickness range at comparably low material cost. However, the SMA integration is performed on a per-device level which results in high assembly cost. The second approach is based on sputter deposition of thin NiTi films directly onto the microstructure, see P. Krulevitch et al.: "Thin film shape memory alloy microactuators", J. Microelectromech. Syst., vol. 5, no. 4, pp. 270-82 (1996), which has the benefit of allowing wafer level processing. However, due to a difficult deposition controllability, the process is limited in reproducibility of transformation temperatures and strains and NiTi sputter deposition is mostly feasible for thicknesses of less than 10 μm, see S. Miyazaki et al.: "Development of high-speed microactuators utilizing sputterdeposited TiNi-base shape memory alloy thin films", Actuator Proc., pp.372-377 (2008).

Wafer level integration of SMA wires onto silicon microstuctures, with the benefit of both wafer level integration and the use of bulk SMA materials, has been shown for microactuators with excellent performance, see D. Clausi et al.: "Design and wafer-level fabrication of SMA wire microactuators on silicon", JMEMS, vol. 19, no. 4 (2010). However, no standardized fabrication process has yet been established or suggested. The placement of the wires requires specially designed tools with manual wire handling, alignment and integration. In contrast, wire bonding is an extremely mature, cost-effective and broadly available backend process for electrical interconnects, see W. J. Greig et al.: "Integrated circuit packaging, assembly and interconnections", Springer, pp.103-128, (2007). It is very attractive to utilize this standard technology due to its very good availability and high performance in terms of reliability, throughput and placement accuracy, with speeds up to 22 bonds per second and placement accuracies within 2 μm. However, direct wire bonding of NiTi SMA wires is not feasible due to the Vickers hardness of the NiTi material, which is one order of magnitude higher, see K. Gall et al.: "Instrumented micro-indentation of NiTi shape-memory alloys", Acta Materialia, vol. 49, no. 16, pp. 3205-3217 (2001), as compared to common wire bonding materials such as gold and aluminum.

SUMMARY OF THE PRESENT INVENTION

The present invention presents the first wafer-level integration concept for NiTi SMA wires onto silicon substrates by using a conventional wire bonding tool.

Wafer level integration of SMA wires with a wire bonder allows a fast placement and fixation of the wires. No additional alignment step is needed. Because of the hardness of NiTi wires the direct wire bonding of these wires on standard gold or aluminum pads is not feasible. The present invention teaches that the wires are instead mechanically fixed by Si clamping and anchor structures on the wafer. These mechanical fixation structures enable the integration of the NiTi wires by using a standard and unmodified wire bonder.

The SMA wire is mechanically fixated with the help of one anchor and one clamp structure, where each fixation pair is placed on opposite sides of the wafer edge.

The present invention teaches that, while using a wire bonder, a free air ball is generated by an electrical discharge, the ball is then anchored in its anchoring structure, the SMA wire is fed and guided over the entire wafer area to its second fixation structure, and the SMA wire is clamped in between silicon cantilevers and finally cut off by truncating the wire by the bond capillary and a high bond force.

ADVANTAGES

The advantages that foremost may be associated with a method and a device according to the present invention are that it provides the first integration of SMA wires into silicon based MEMS structures using a standard wire bonder. This approach allows fast and efficient placement, alignment and mechanical attachment of NiTi-based SMA wires to silicon-based MEMS. The wires are mechanically anchored and clamped into deep-etched silicon structures on a wafer. The placement precision is high with an average deviation of 4 μm and the mechanical clamping is strong, allowing successful actuation of the SMA wires.

BRIEF DESCRIPTION OF THE DRAWINGS

A method and a device according to the present invention will now be described in detail with reference to the accompanying drawings, in which:

FIG. 7a is drawing of a cross-section, the red dashed outline representing the chip in a hot state, FIG. 7b shows an image of an slightly actuated device on a hotplate with a temperature of 70° C., and FIG. 7c shows an image of a device with increased actuation at 90° C.

DESCRIPTION OF EMBODIMENTS AS PRESENTLY PREFERRED

Figure 1:
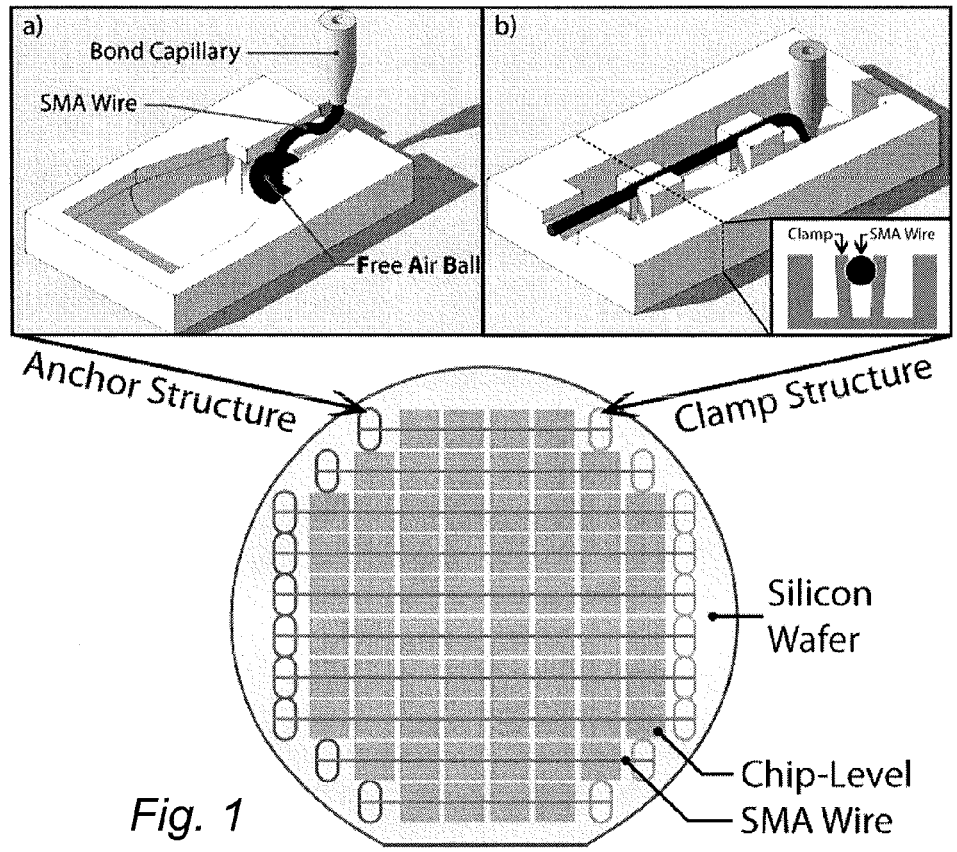
FIG. 1 is an illustration of the wafer-level integration concept.

The present invention will now be described with reference to FIG. 1 showing an illustration of the wafer-level integration concept. The SMA wire is mechanically fixated with the help of one anchor and one clamp structure. Each fixation pair is placed on opposite sides of the wafer edge.

The basic integration concept is depicted in FIG. 1. The integration of a SMA wire is separated into wafer- and chip-level integration. Wafer-level integration combines aligning and fixation of a SMA wire on a silicon wafer. The final mechanical and electrical integration can then be performed on chip-level to form the actuator itself.

Figure 2:
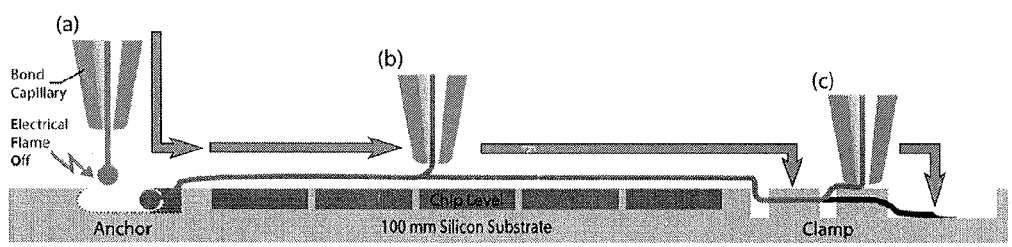
FIG. 2 is a cross sectional view of the integration flow.

FIG. 2 shows a cross sectional view of the integration flow. First, the free air ball is generated by an electrical discharge (a). The ball is then anchored in its anchoring structure. The SMA wire (37.5 µm diameter) is fed and guided over the entire wafer area to its second fixation structure (b). The SMA wire is clamped in between silicon cantilevers and finally cut off by truncating the wire by the bond capillary and a high bond force (c).

On wafer-level, the SMA wire is attached using two different mechanical structures in a defined position with high placement accuracy across the entire wafer. Based on a ball-wedge wire bonding process, a free air ball is generated and subsequently anchored in the first integration structure, as shown in FIG. 1a. The SMA wire is fixed and can be guided across the wafer towards the clamping structure, as shown in FIG. 1b, where the SMA wire is mechanically attached. This wafer-level integration allows in a second step a further attachment also on chip-level. However, the focus of the present invention lies on the design and development of the wafer-level integration.

Using this integration concept, full wafers can be populated with SMA wires at high placement accuracies. Furthermore using a wire bonder offers high throughput and high reproducibility of the integration process. The complete integration of SMA wires is done at room temperature, thus avoiding the triggering of the SMA transformation, which occurs at elevated temperatures of typically 90° C. Hence this enables integration of prestrained SMA wires. In addition this integration concept is CMOS compatible, offering the possibility for integrating microelectronic devices with microactuators.

As an example it is shown that the wire hooking and clamping structures can be fabricated on a 100 mm silicon substrate. Publication by N. Roxhed et al.: "A method for tapered deep reactive ion etching using a modified Bosch process", JMM, vol. 17, pp. 1087-1092, (2007) shows that both types of structures can be realized by a sequence of anisotropic and isotropic DRIE steps. Etching of both integration structures were performed in a STS ICP etch reactor.

In this example the fabrication of both fixation structures requires one lithography and DRIE process each. The first lithography was performed with standard photoresist, which was applied by spin-coating. The second photoresist application was performed by spray-coating of diluted resist in order to ensure a full protection of the deep-etched structures, which were created by the first DRIE process. As a final step all photoresist residuals were removed by plasma ashing.

Figure 3:
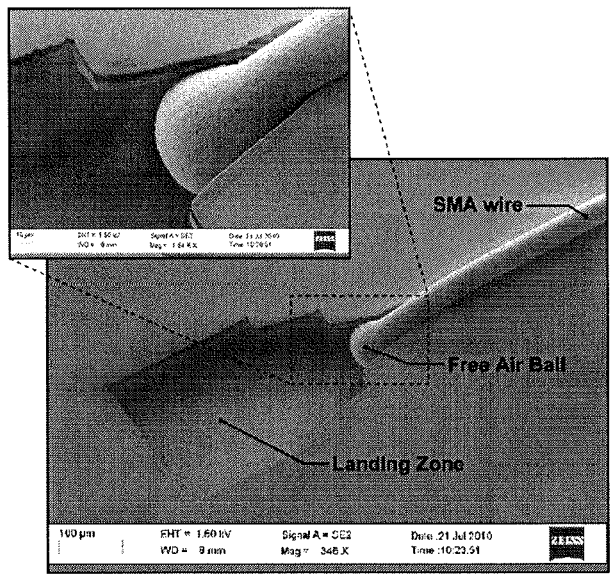
FIG. 3 is a SEM image of an anchor structure, which was fabricated by combined anisotropic and isotropic deep reactive ion etching in three steps.

The present invention proposes an anchor structure, which fixes the start of the wire, which is depicted in FIG. 1a and FIG. 3. It consists of two functional parts, the landing zone and the anchor part. The landing zone enables lowering of the SMA ball into the anchor structure and subsequently fixation into the adjacent anchor part. The etch geometry is crucial for a proper anchoring of the SMA ball. The anchoring of the SMA ball is achieved by a specific undercut etch profile of the anchor structure itself. First an anisotropic trench was etched, followed by a passivation of the vertical sidewalls. Subsequently an isotropic etch creates an undercut underneath the anisotropic etch profile.

Figure 4:
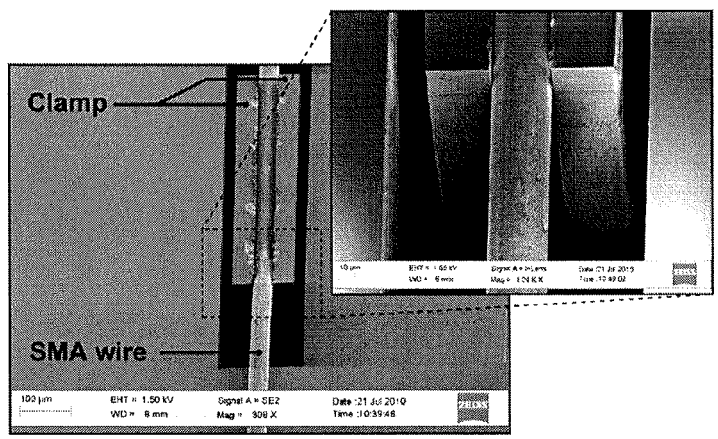
FIG. 4 is a SEM image of a clamp fixation with a magnified view on one clamp feature.

The silicon structure for the wire end combines two functional parts, i.e. the clamping structure and the cut off zone. FIG. 1b and FIG. 4 depicts the clamping structure with a pair of facing vertical cantilevers. Two pairs of facing vertical cantilevers clamp the SMA wire in between them. The first pair fixes and aligns the SMA wire. The second pair stabilizes the SMA wire for the truncation. The anisotropic etch profile of the clamping structure contains a small chamfer in the upper section of the cantilevers, which is realized by a short isotropic etch. The chamfers ensure a constant height of the SMA wire in the clamp, as depicted in FIG. 4.

It is possible to use a semi-automatic wire-bonder, such as Delvotec 5410, to integrate the wires. This can be used with a commercially available pre-strained NiTi SMA wire, such as Flexinol®, 37.5 µm in diameter, with a transformation temperature of 90° C. Because the wire was already prestrained, no special tool for prestraining the wires was needed. The wire integration, depicted in FIG. 2, starts with forming a free air ball caused by an electrical discharge, which locally melts the wire on the tip of the bond capillary. The liquid metal at the end of the SMA wire rolls up and forms a free air ball. The Electrical Flame Off (EFO) is performed in helium atmosphere, since the TiNi alloys tend to oxidize in air during rapid melting by glow discharges, see T. Goryczka et al.: "Characterization of nitrided/oxidized layers covering NiTi shape memory alloy", Solid State Phenomena, vol. 54, pp. 151-154, (2007). The free air ball is then lowered into the landing zone and subsequently hooked into its adjacent anchoring part. By utilizing the wire bonder, the SMA wire is placed over the wafer to the clamping structure where it is pushed in between pairs of facing cantilevers. Finally, the SMA wire is cut off by truncating the wire with the bond capillary and a high bond force.

This integration approach for SMA wires opens a wide range of different integration methods on chip level, which can then be used for manufacturing of high performance actuators with for example polymer fixation, or by using the clamp structures to fixate SMA wires also on individual chips.

FIG. 3 depicts an anchor structure that was fabricated by combined anisotropic and isotropic deep reactive ion etching in three subsequent steps. Both the underetched (out of plane) sidewall structure and the tapered (in-plane) design safely fixes the SMA wire with its anchor. This design is very forgiving towards unequally formed and/or sized free air balls and thus ensures a reliable anchoring of the SMA wire.

FIG. 4 is a SEM image of a clamp fixation with a magnified view on one clamp feature. It is proposed that the wire is pushed in between the facing pair of cantilevers with the help of the wire bonder. Four similar clamps can be used for the fixation of each wire.

It has been found that clamping structures with cantilever dimensions of 50×500×220 µm, as depicted in FIG. 4, fixed the SMA wire mechanically most stable. A force of xxx mN was necessary to snap the wire into the clamp structure.

Figure 5:
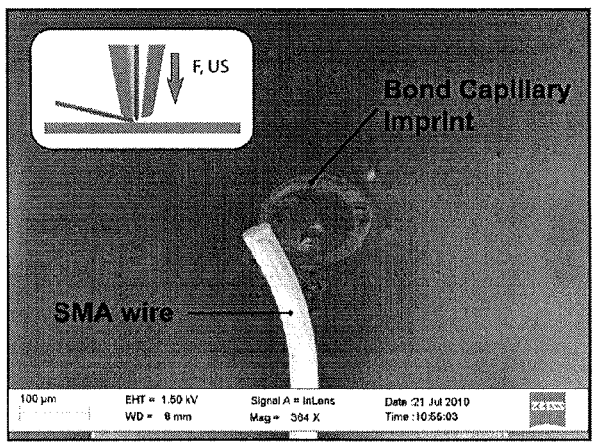
FIG. 5 is a SEM image of a truncated SMA wire.

The final step of the wire integration is the wire truncation, which can be performed analog to a stitch bond. However, the use of a very high bond force of xxx mN and ultrasonics result in a straight cut of the wire and in contrast to conventional wire bonding not in a deformation and micro weld of the wire to the surface, as depicted in FIG. 5. This indicates also that it is not feasible to fix SMA wires by the means of traditional wire bonding.

The use of a high bond force and ultrasonics result in a straight cut of the wire and in contrast to conventional wire bonding not in a deformation and micro weld of the wire to the surface, as shown in FIG. 5.

Figure 6:
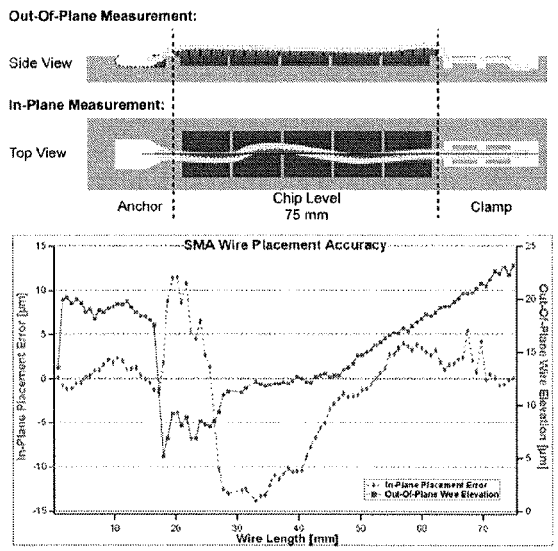
FIG. 6 is a graph with White Light Interferometric measurement data for the alignment accuracy of a SMA wire.

The presented wafer-level integration method also comprises the alignment of the SMA wire on chip-level. The placement accuracy of this integration method has been analysed with an optical profilometer, Wyko NT9300. As depicted in FIG. 6, both the in-plane wire placement deviation from the ideal geometrical anchor-to-clamp center line and the distance from the wire to the substrate, i.e. chip-level, was determined. The sample, a 75 mm long SMA wire with a diameter of 37.5 µm was integrated on a 100 mm silicon substrate. The in-plane average deviation is 4.19±4.22 ($\sigma$) µm with a maximum of 13.9 µm. The out-of-plane distance of the SMA wire to the substrate is in average 15.6±4.5 ($\sigma$) µm and maximal 23.2 µm, as shown in FIG. 6. This is an important measure for the design of the chip-level fixation of the SMA wire, which could e.g. be performed with Ni-electroplating in a subsequent step, see D. Clausi et al.: "Wafer-level mechanical and electrical integration of SMA wires to silicon MEMS using electroplating", MEMS Proc. (2011).

In addition, a basic evaluation of the mechanical robustness of the anchor and clamp structures was performed by implementing a simple actuator. This actuator is based on a 300 µm thick silicon cantilever with a length of 100 mm and a width of 2 mm as cold state reset and two parallel integrated 75 mm long SMA wires as actuation. The energy input is provided by a hotplate on which the actuator is fixed on one side to enhance the thermal contact.

FIG. 7a illustrates the cross section of the actuator both in actuated and idle position. FIG. 7b depicts the actuator in a semi and FIG. 7c in fully actuated state. It reveals that both SMA wire fixation elements withstand the force that is generated by the SMA wires, which is 200 mN according to the wire data sheet, see DYNALLOY, Inc., "Technical characteristics of flexinol actuator wires", Datasheet, F1140Rev H, pp. 6. The actuation was performed several hundred times without failure.

FIG. 6 also shows White Light Interferometric measurement data for the alignment accuracy of a SMA wire with a length of 75 mm and a diameter of 37.5 µm. As indicated in the drawing, the out-of-plane measurement (blue straight graph) determines the distance between the wire and the substrate, the in-plane measurement (red dashed graph) determines the lateral wire placement deviation from an ideal geometrical anchor-to-clamp center line.

Figure 7:
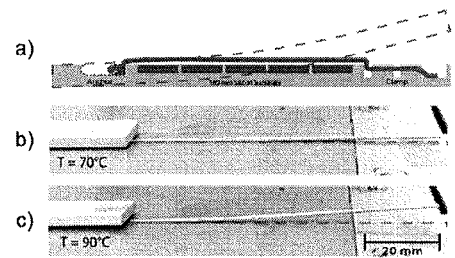
FIG. 7 illustrates a verification of the mechanical stability of the presented wire fixation approach, where

In order to verify the mechanical stability of the presented wire fixation approach, two 75 mm long SMA wires have been integrated in parallel on a silicon chip with a size of 3×100 mm, as illustrated in FIG. 7. FIG. 7a is drawing of a cross-section; the red dashed outline represents the chip in a hot state. FIG. 7b shows an image of an slightly actuated device on a hotplate with a temperature of 70° C., and FIG. 7c shows a device with increased actuation at 90° C.

Wafer level integration of shape memory alloy wires using standard wire bonder equipment has been successfully demonstrated. Even though the SMA wire integration was performed with a semi-automatic wire bonder an excellent placement accuracy could be achieved in this work. The usage of fully automated wire bonding equipment with optical pattern recognition and alignment systems potentially further improve these results and enables the implementation of this technique for mass production. The anchoring and clamping of SMA wire showed an excellent robustness, which indicates the applicability of this integration concept also on chip-/actuator-level.

Different embodiments will now be shown for mechanical fixation as well as for the electrical connection of the Shape Memory Alloy wire.

The wire is fed through the bond-capillary of a wire bonder. To allow the pulling of the wire, the tip of the wire must be fixated on the substrate. In this concept, the tip of the wire is deformed, so that the diameter of the wire-tip is larger than the diameter of the remaining wire and the bond capillary. This allows to hook-in the wire tip or to squeeze the wire into squeeze-fit structures in the substrate.

Figure 8:
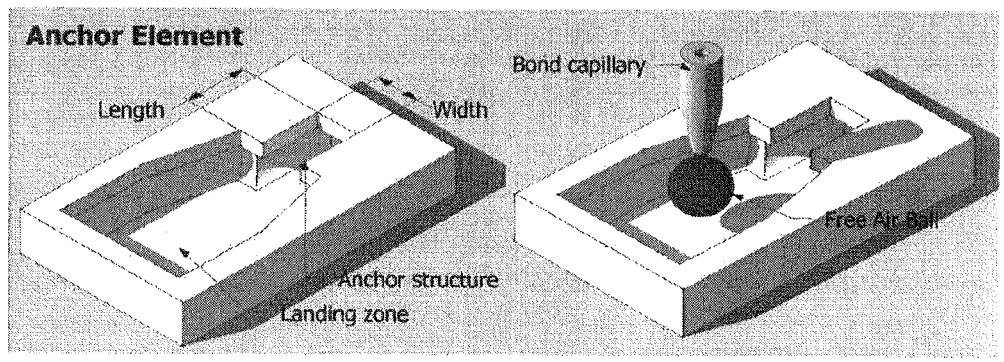
FIG. 8 is a schematic illustration of the concept of preparing a hook-in structure on the substrate and for the hook-in of a SMA wire.
Figure 8:
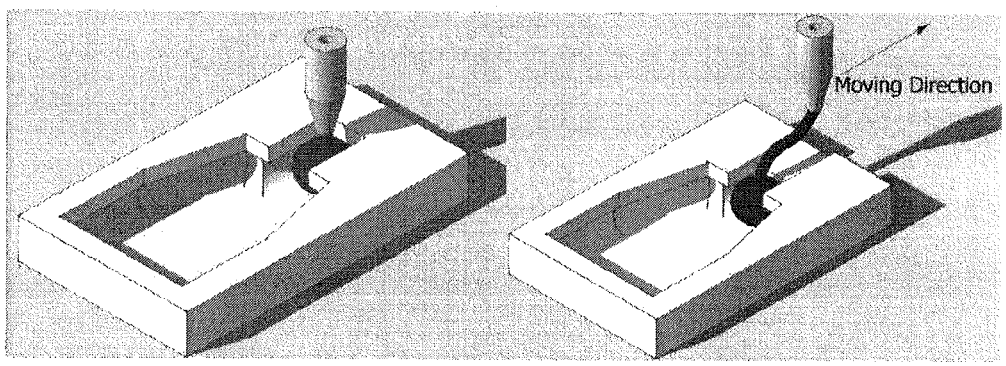

FIG. 8 illustrates one concept already shown in relation to FIGS. 1, 2 and 3. A hook-in structure is formed in the substrate, FIG. 8a, then the Free Air Ball is formed, FIG. 8b, which is hooked into the structure in the substrate, FIG. 8c, and allows to pull the SMA wire through the bond capillary, FIG. 8d.

Figure 9:
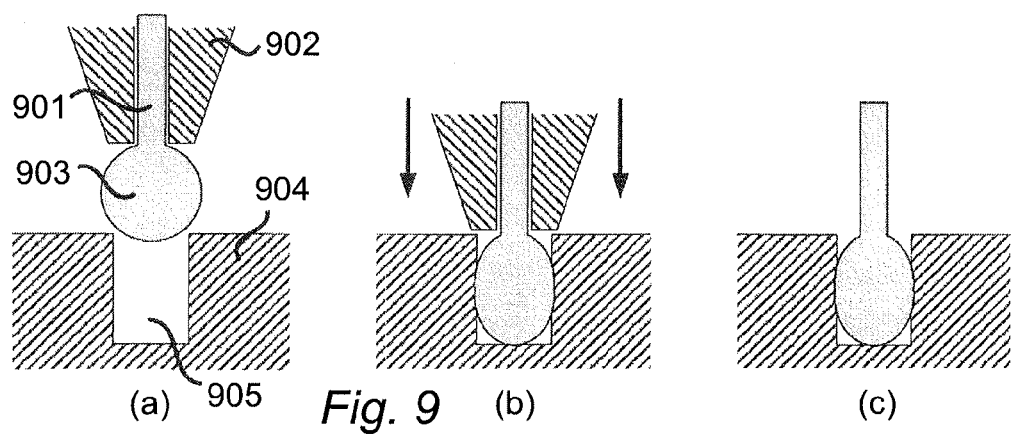
FIG. 9 is a schematic and simplified illustration of a squeeze fit of a SMA wire tip.

Another concept is the anchoring using squeeze fit of the Free Air Ball into squeeze-fit structure on the substrate, as schematically illustrated in FIG. 9. The SMA wire (901) is fed through the bond capillary (902) and a Free Air Ball (903) is formed. In the substrate (904), a trench (905) is formed with the diameter smaller than the diameter of the Free Air Ball (FIG. 9a). The diameter of the Free Air Ball is larger than the diameter of the bond capillary, which allows to squeeze the Free Air Ball into the trench in the substrate (FIG. 9b). The tip of the SMA wire is anchored by the squeeze fit of the Free Air Ball into the trench of the substrate (FIG. 9c).

Figure 10:
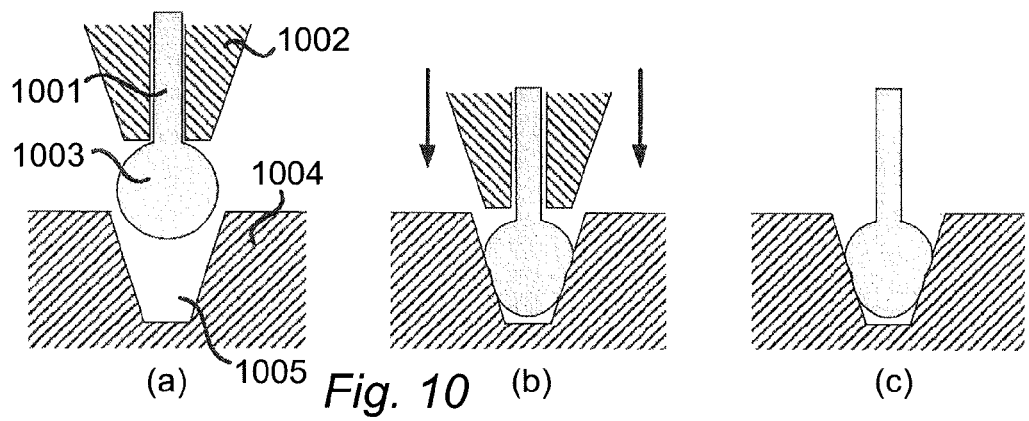
FIG. 10 is a schematic and simplified illustration of a squeeze fit of a SMA wire tip into a V-groove in a silicon substrate fabricated by anisotropic etching.

As schematically illustrated in FIG. 10, the same concept is suitable for squeeze-fit of the Free Air Ball into a V formed trench as for example obtained when etching a silicon substrate with special processes. The SMA wire (1001) is fed through the bond capillary (1002) and a Free Air Ball (1003) is formed. In the substrate (1004), a V shaped trench (1005) is formed (FIG. 10a). The diameter of the Free Air Ball is larger than the diameter of the bond capillary, which allows to squeeze the Free Air Ball into the trench in the substrate (FIG. 10b). The tip of the SMA wire is anchored by the squeeze fit of the Free Air Ball into the trench of the substrate (FIG. 10c).

Figure 11:
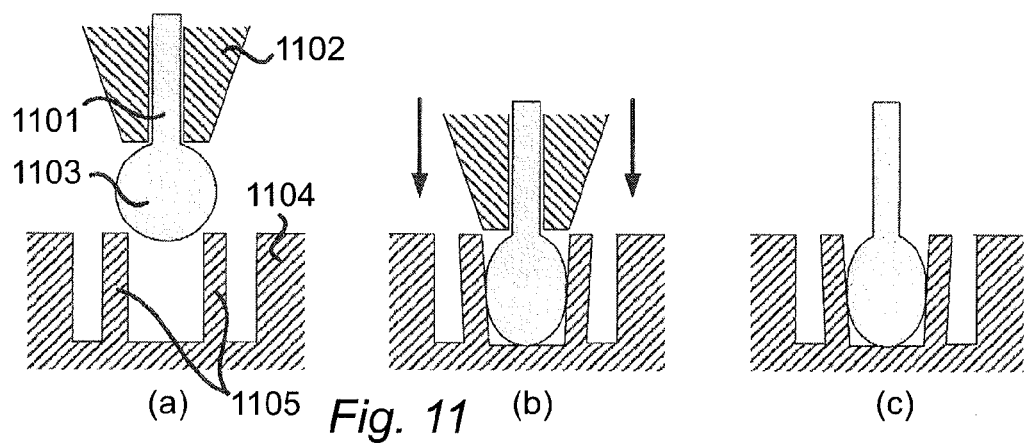
FIG. 11 is a schematic and simplified illustration of a squeeze fit of a SMA wire tip into elastically deformable structures.

FIG. 11 schematically illustrates a further variation of the squeeze-fit concept, where deformable clamping structures are formed in the substrate which allows for variations in the SMA wire diameter. The SMA wire (1101) is fed through the bond capillary (1102) and a Free Air Ball (1103) is formed. In the substrate (1104), deformable clamp structures (1105) are formed (FIG. 11a). The diameter of the Free Air Ball is larger than the diameter of the bond capillary, which allows to squeeze the Free Air Ball into the deformable structures in the substrate (FIG. 11b). The clamp structures elastically deform during the squeeze of the Free Air Ball (FIG. 11b) and thereby adapt to diameter variations of the SMA wire and hold them in place (FIG. 11c).

Figure 12:
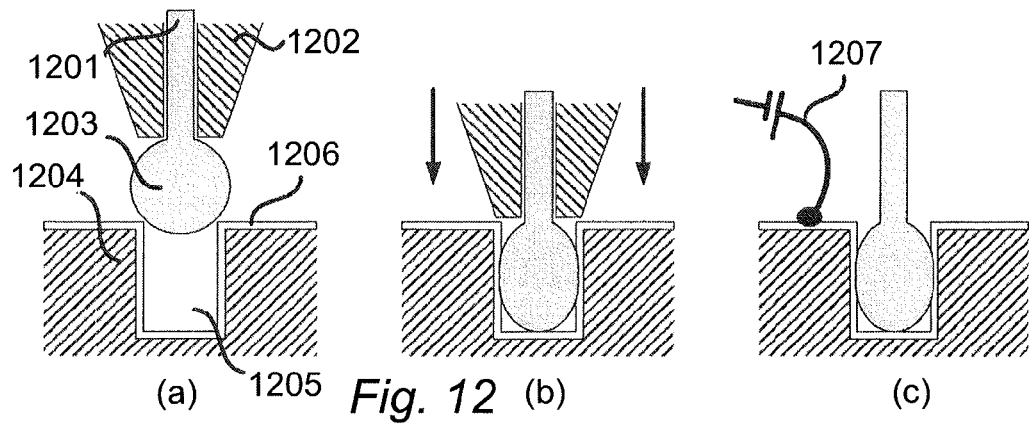
FIG. 12 is a schematic and simplified illustration of a squeeze fit of a SMA wire tip with metal liner on the substrate for mechanical and electrical interconnection.
Figure 13:
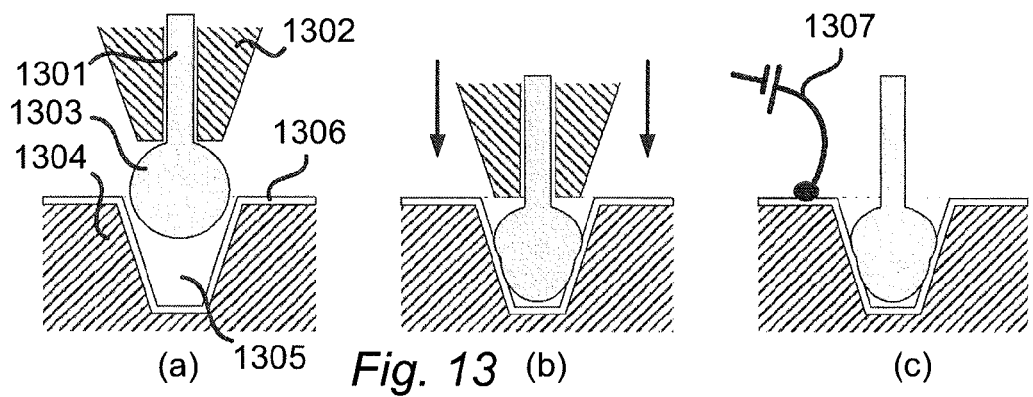
FIG. 13 is a schematic and simplified illustration of a squeeze fit of a SMA wire tip into a V-groove with metal liner on the substrate for mechanical and electrical interconnection.
Figure 14:
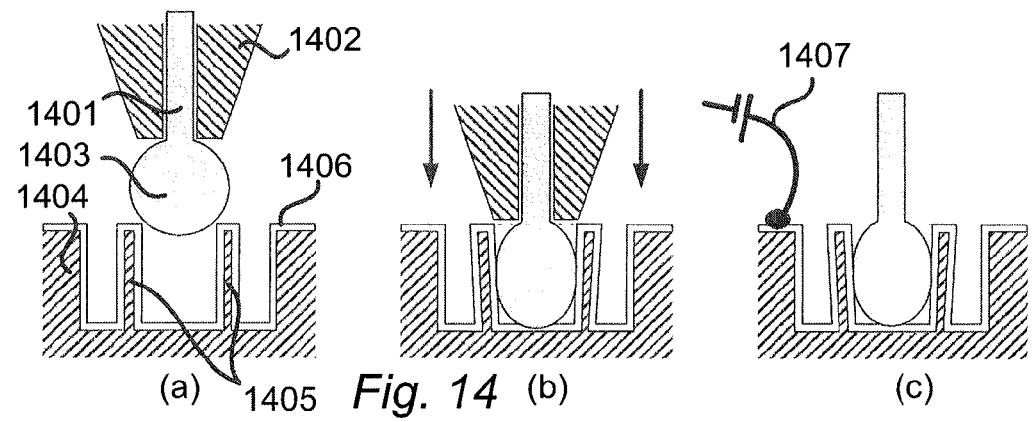
FIG. 14 is a schematic and simplified illustration of a squeeze fit of a SMA wire tip into elastically deformable structures with metal liner on the substrate for mechanical and electrical interconnection.

All the above described concepts schematically illustrated in FIGS. 9 to 11 are adaptable to enable electrical contacting of the SMA wire at the same time as the mechanical fixation is performed. This allows for a simple contacting and Joule heating of the SMA wire above the conversion temperature. FIGS. 12 to 14 schematically illustrates the concept. The SMA wire (1201, 1301, 1401) is fed through the bond capillary (1202, 1302, 1402) and a Free Air Ball (1203, 1303, 1403) is formed. On the substrate (1204, 1304, 1404) trenches (1205, 1305) or deformable clamp structures (1405) are formed. Finally, a metal film (1206, 1306, 1406) is deposited onto the substrate (FIGS. 12a, 13a, 14a). The diameter of the Free Air Ball is larger than the diameter of the bond capillary, which allows to squeeze the Free Air Ball into the trench in the substrate (FIGS. 12b, 13b, 14b). During the squeezing, the native oxide on the SMA is broken up and the SMA is in direct contact with the metal on the substrate. Thereby, the SMA can be electrically contacted (1207, 1307, 1407) via the metal film (FIGS. 12c, 13c, 14c).

Figure 15:
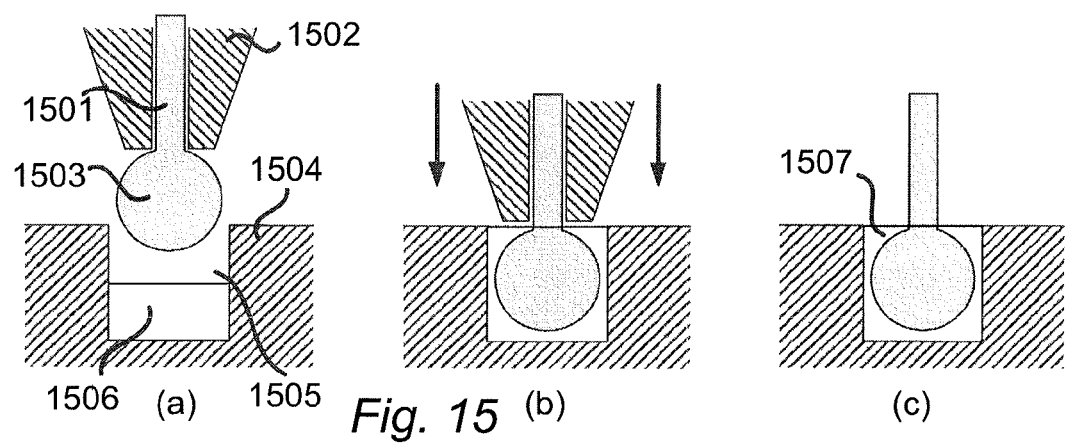
FIG. 15 is a schematic and simplified illustration of adhesive fixation of a free air ball.
Figure 16:
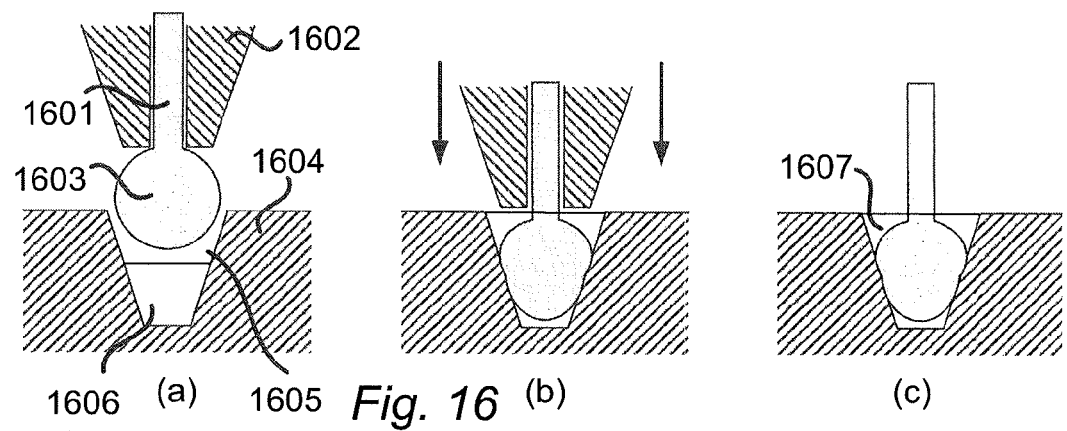
FIG. 16 is a schematic and simplified illustration of adhesive fixation of a free air ball into a V-groove.

Instead of using squeeze-fits with and/or without metal liner as illustrated in FIGS. 9 to 14, the trenches in the substrate can be filled with adhesive to adhesively anchor the Free Air Ball and the wire in the trenches. FIGS. 15 and 16 schematically illustrate this concept with FIG. 15 for straight trenches similar to FIG. 9 and FIG. 16 for V-shaped trenches similar to FIG. 10. The SMA wire (1501, 1601) is fed through the bond capillary (1502, 1602) and a Free Air Ball (1503, 1603) is formed. In the substrate (1504, 1604), straight (1505) or V-shaped trenches (1605) are formed, which are then partially filled with adhesive (1506, 1606) (FIGS. 15a, 16a). The diameter of the Free Air Ball is larger than the diameter of the bond capillary, which allows squeezing the Free Air Ball into the adhesive in the trenches in the substrate (FIGS. 15b, 16b). The Free Air Ball is embedded in adhesive, which is cured (1507, 1607) and thereby anchors the Free Air Ball (FIGS. 15c, 16c).

Figure 17:
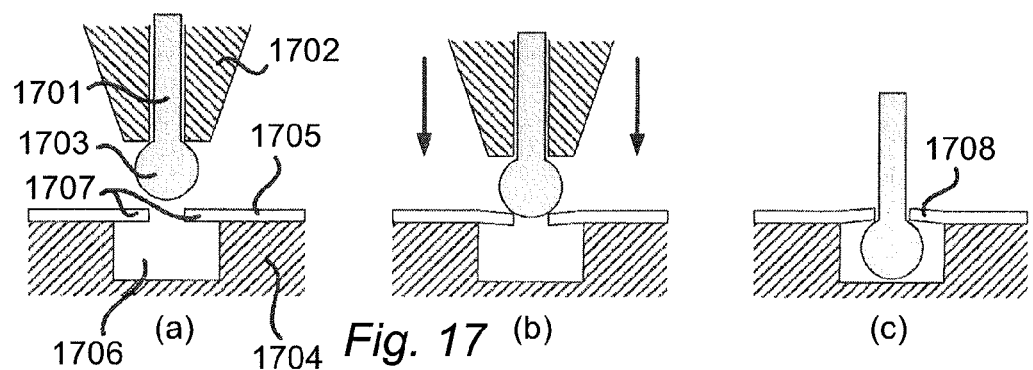
FIG. 17 is a schematic and simplified illustration of a snap-fixation of a free air ball.

Besides squeeze fit and adhesive anchoring, a snap-in structure can be fabricated to snap the Free Air Ball in to. FIG. 17 schematically illustrates this concept. The SMA wire (1701) is fed through the bond capillary (1702) and a Free Air Ball (1703) is formed. In the substrate (1704), a trench (1706) is formed and on top of the substrate a thinner layer is formed (1705) which partially covers the trench (1706) but has an opening in the center of the trench, thereby creating snap-in structures (1707) (FIG. 17a). The diameter of the Free Air Ball is larger than the diameter of the bond capillary, which allows to push the Free Air Ball through the opening of the top layer (1705) into the trench in the substrate (FIG. 17b). The top layer snaps back (1708) and holds the Free Air Ball in place (FIG. 17c).

Figure 18:
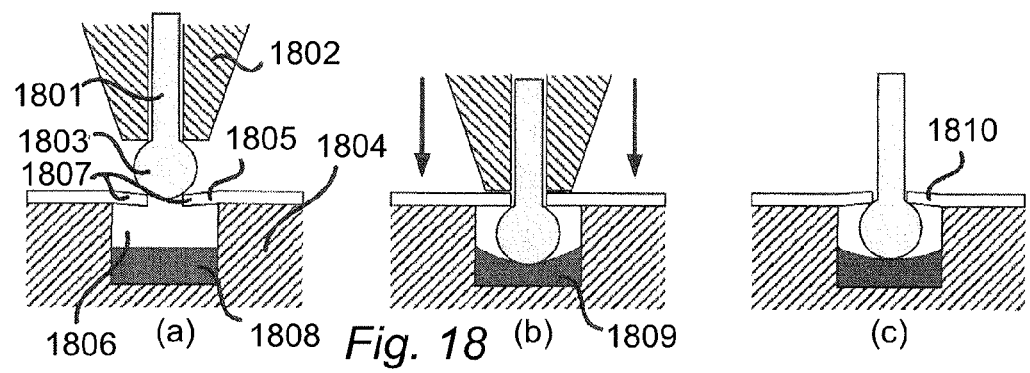
FIG. 18 is a schematic and simplified illustration of a snap-fixation of a free air ball with a spring load.

A variation of the concept schematically illustrated in FIG. 17 is to provide a spring in the trench which presses the Free Air Ball against the snap structures in the top layer. FIG. 18 schematically illustrates the concept. The SMA wire (1801) is fed through the bond capillary (1802) and a Free Air Ball (1803) is formed. In the substrate (1804), a trench (1806) is formed and on top of the substrate a thinner layer is formed (1805) which partially covers the trench (1806) but has an opening in the center of the trench, thereby creating snap-in structures (1807) (FIG. 18a). In the bottom of the trench (1806) a layer (1808) is formed which is elastically deformable. After squeezing the Free Air Ball through the snap-in structures, the Free Air Ball compresses the deformable layer (1808) (FIG. 18b). When removing the bond capillary, the elastically deformed layer (1809, 1810) presses the Free Air Ball into the snap-in structures, which are strong enough to withstand the forces generated by the elastically deformed layer (FIG. 18c).

After fixing the tip of the wire (1801) with the Free Air Ball, the wire is pulled through the bond capillary (1802) and spanned across the substrate (1804) to the next clamp structure. In this clamp structure, the wire is clamped and therefore all the concepts shown in FIGS. 9 to 18 are adaptable.

Figure 19:
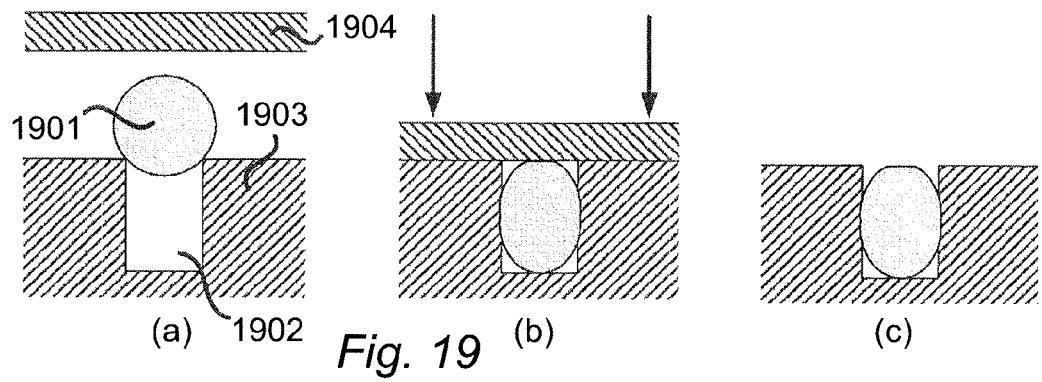
FIG. 19 is a schematic and simplified illustration of a squeeze fit of a SMA wire.
Figure 20:
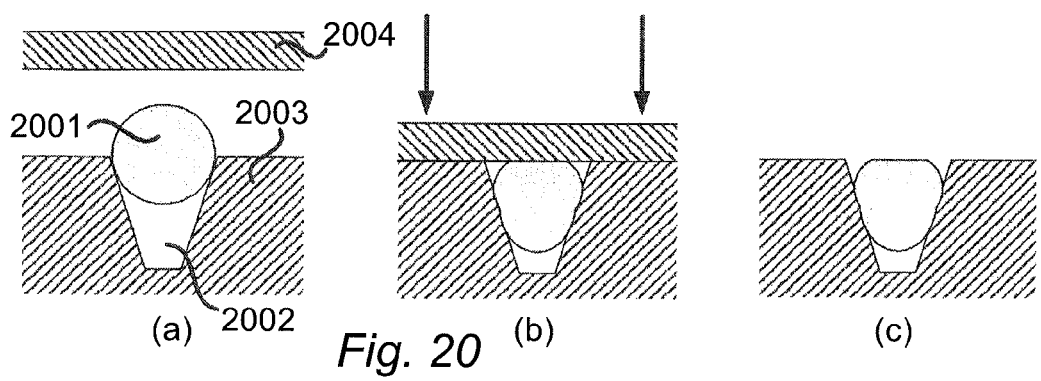
FIG. 20 is a schematic and simplified illustration of a squeeze fit of a SMA wire into a V-groove in a silicon substrate fabricated by anisotropic etching.
Figure 21:
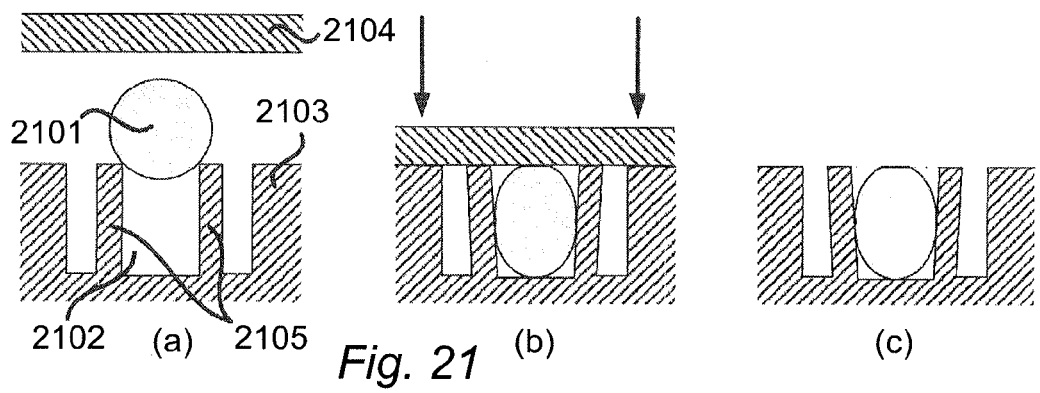
FIG. 21 is a schematic and simplified illustration of a squeeze fit of a SMA wire into elastically deformable structures.

FIGS. 19 to 21 schematically illustrate the squeeze fit schemes adapted for squeeze fitting of SMA wires. Using the wire-bonder, the SMA wire (1901, 2001, 2101) is placed above the trench (1902, 2002, 2102) which is formed in the substrate (1903, 2003, 2103) with the diameter smaller than the diameter of the SMA wire (FIGS. 19*a*, 20*a*, 21*a*). FIGS. 19 and 20 illustrate squeeze fitting with straight and V-shaped trenches, respectively. FIG. 21 is based on the concept shown in FIG. 11 and features deformable clamping structures (2105) in the substrate which allow for variations in the SMA wire diameter. The wire is squeezed into the trenches and/or deformable clamping structures using a piston (1904, 2004, 2104), which for example could be a second substrate which is pressed onto the wire and the second substrate in a wafer bonder (FIGS. 19*b*, 20*b*, 21*b*). The piston is then removed and the wire remains in the trench (FIGS. 19*c*, 20*c*, 21*c*) following the same principles as in the concepts shown in FIGS. 9, 10 and 11.

Figure 22:
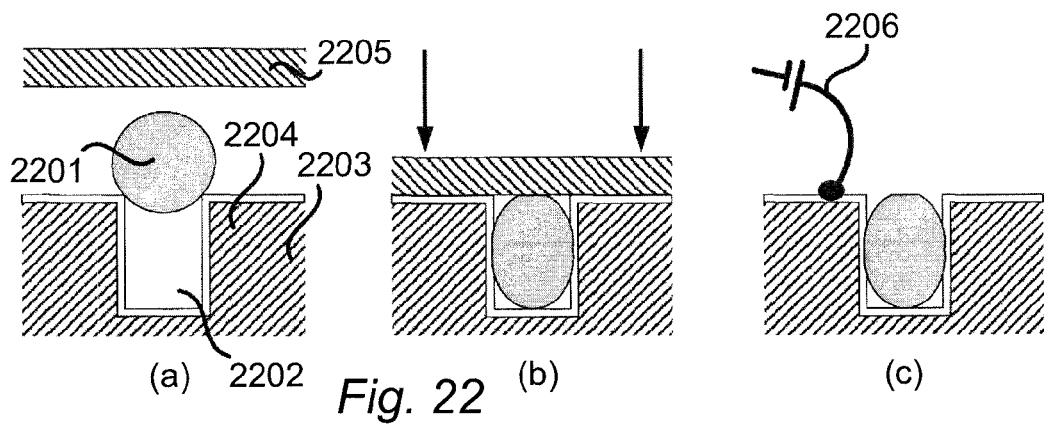
FIG. 22 is a schematic and simplified illustration of a squeeze fit of a SMA wire with metal liner on the substrate for mechanical and electrical interconnection.
Figure 23:
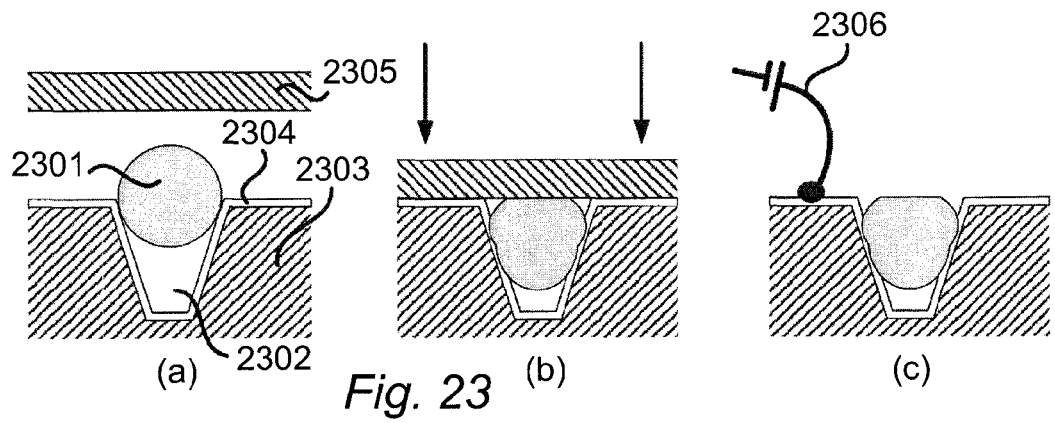
FIG. 23 is a schematic and simplified illustration of a squeeze fit of a SMA wire into a V-groove with metal liner on the substrate for mechanical and electrical interconnection.
Figure 24:
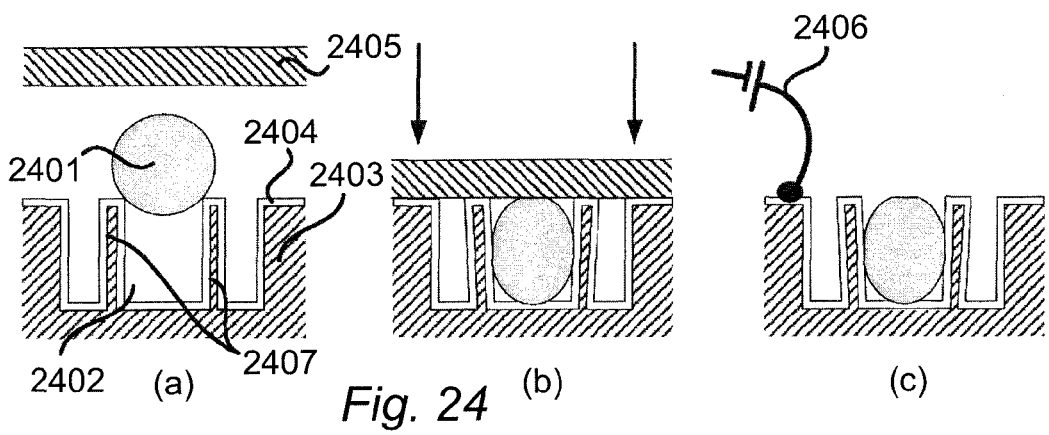
FIG. 24 is a schematic and simplified illustration of a squeeze fit of a SMA wire into elastically deformable structures with metal liner on the substrate for mechanical and electrical interconnection.

The concepts schematically illustrated in FIGS. 19 to 21 are adaptable to enable electrical contacting of the SMA wire at the same time as the mechanical fixation is performed. This allows for a simple contacting and Joule heating of the SMA wire above the conversion temperature. FIGS. 22 to 24 schematically illustrate the concept. The SMA wire (2201, 2301, 2401) is placed above the trench (2202, 2302, 2402) which is formed in the substrate (2203, 2303, 2403) and covered with a metal liner (2204, 2304, 2404). The trench diameter is smaller than the diameter of the SMA wire (FIGS. 22*a*, 23*a*, 24*a*). FIGS. 22 and 23 illustrate squeeze fitting with straight and V-shaped trenches, respectively. FIG. 24 is based on the concept shown in FIGS. 11 and 21 and features deformable clamping structures (2407) in the substrate which allow for variations in the SMA wire diameter. The wire is squeezed into the trenches and/or deformable clamping structures using a piston (2205, 2305, 2405), which for example could be a second substrate which is pressed onto the wire and the second substrate in a wafer bonder (FIGS. 22*b*, 23*b*, 24*b*). During the squeezing, the native oxide on the SMA is broken up and the SMA is in direct contact with the metal on the substrate. Thereby, the SMA can be electrically contacted (2206, 2306, 2406) via the metal film (FIGS. 22*c*, 23*c*, 24*c*).

Figure 25:
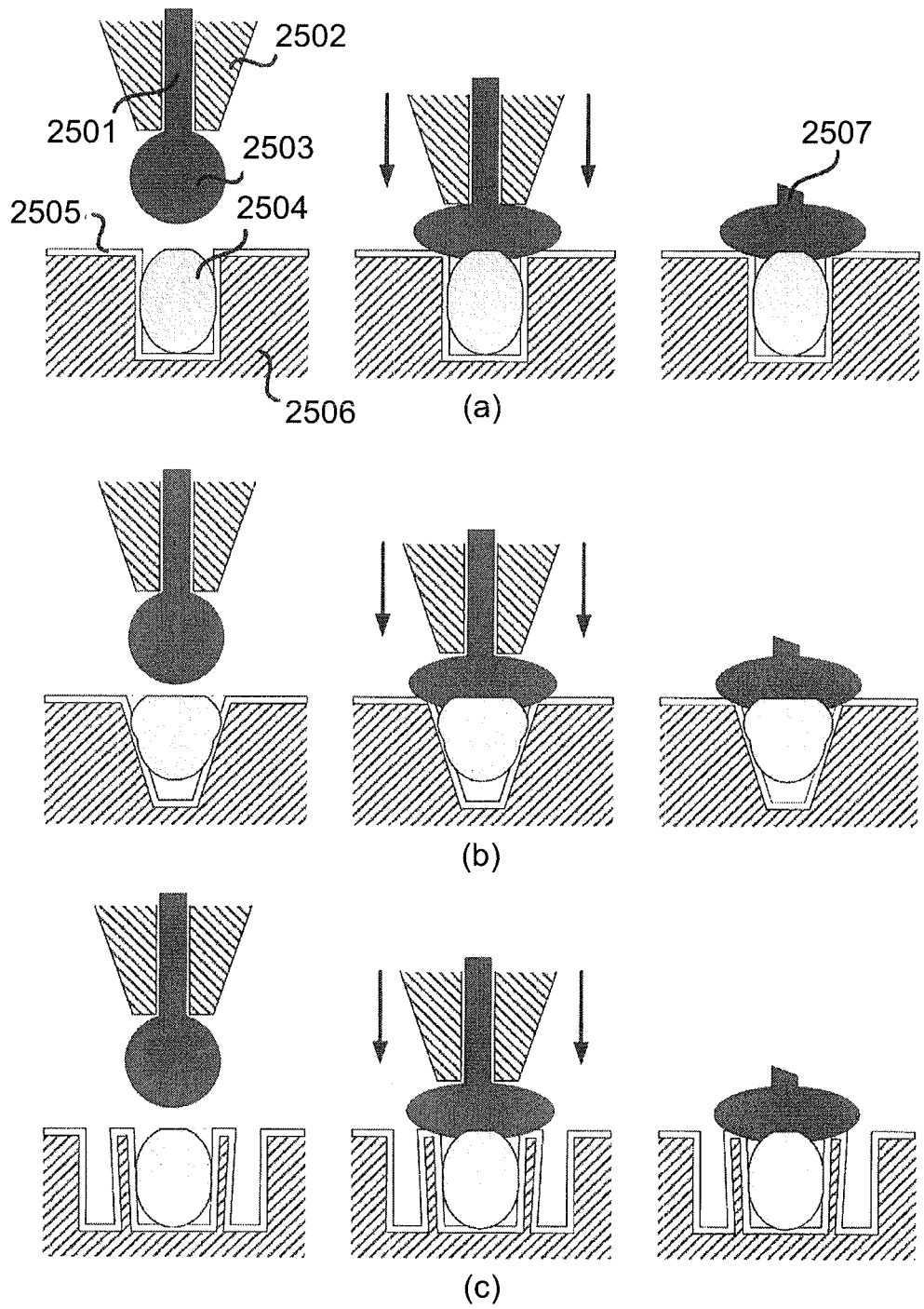
FIG. 25 is a schematic and simplified illustration of an additional fixation with ball-bonds on a metal lied squeeze fit structures and a SMA wire.

The concept with metal liners on the clamp structures shown in FIGS. 22 to 24 can be enhanced with ball bonds as illustrated in FIG. 25. Onto the metal on the final structures of FIGS. 22 to 24, several Free Air Balls are bonded to mechanically support the clamping of the wires into the clamp structures. The SMA wire (2501) is fed through the bond capillary (2502) and a Free Air Ball (2503) is formed (FIG. 25*a*). The Free Air Ball is bonded onto the clamped wire (2504) and the adjoining metal liner (2505) on the substrate (2506) (FIG. 25*b*). Then, the wire is cut using a high bond energy (2507) (FIG. 25*c*).

Figure 26:
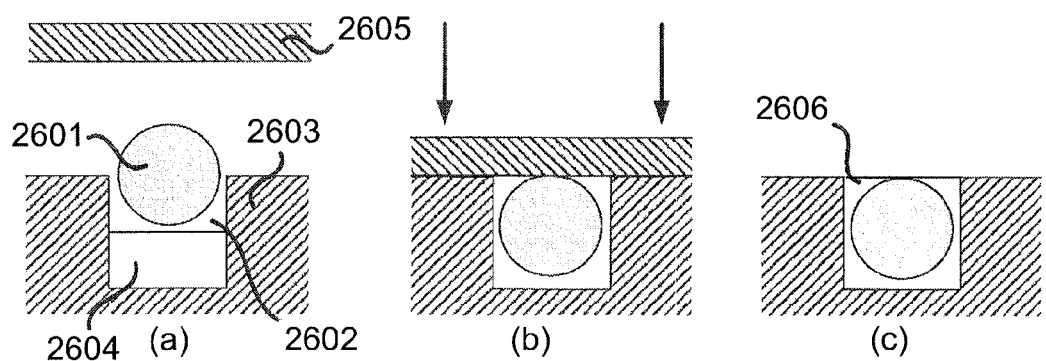
FIG. 26 is a schematic and simplified illustration of adhesive fixation of a SME wire in a straight trench.
Figure 27:
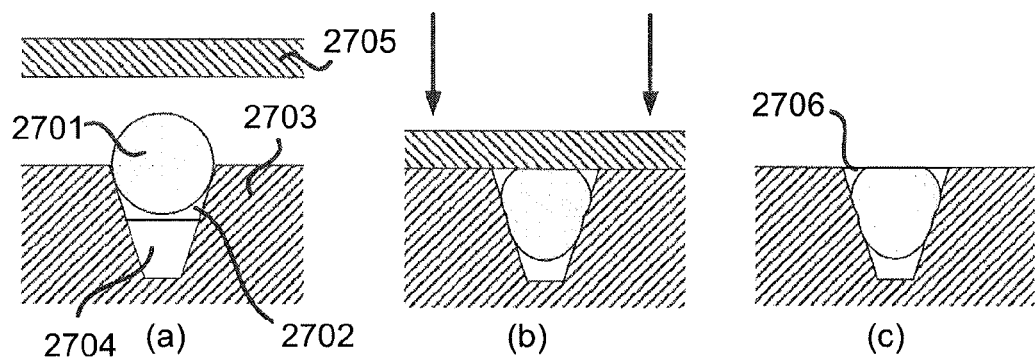
FIG. 27 is a schematic and simplified illustration of adhesive fixation of a SME wire in a v-shaped groove.

Similar to the concepts illustrated in FIGS. 15 to 16 the trenches in the substrate can be filled with adhesive to adhesively anchor the wire in the trenches. FIGS. 26 and 27 schematically illustrate this concept with FIG. 26 for straight trenches and FIG. 27 for V-shaped trenches. The SMA wire (2601, 2701) is placed above the trench/groove (2602, 2702) which is formed in the substrate (2603, 2703) and partially filled with adhesive (2604, 2704) (FIGS. 26*a*, 27*a*). The wire is squeezed into the adhesive in the trenches using a piston (2605, 2705), which for example could be a second substrate which is pressed onto the wire and the second substrate in a wafer bonder (FIGS. 26*b*, 27*b*). Then the wire is embedded in adhesive, which is cured (2606, 2706) and thereby anchors the wire (FIGS. 26*c*, 27*c*).

Figure 28:
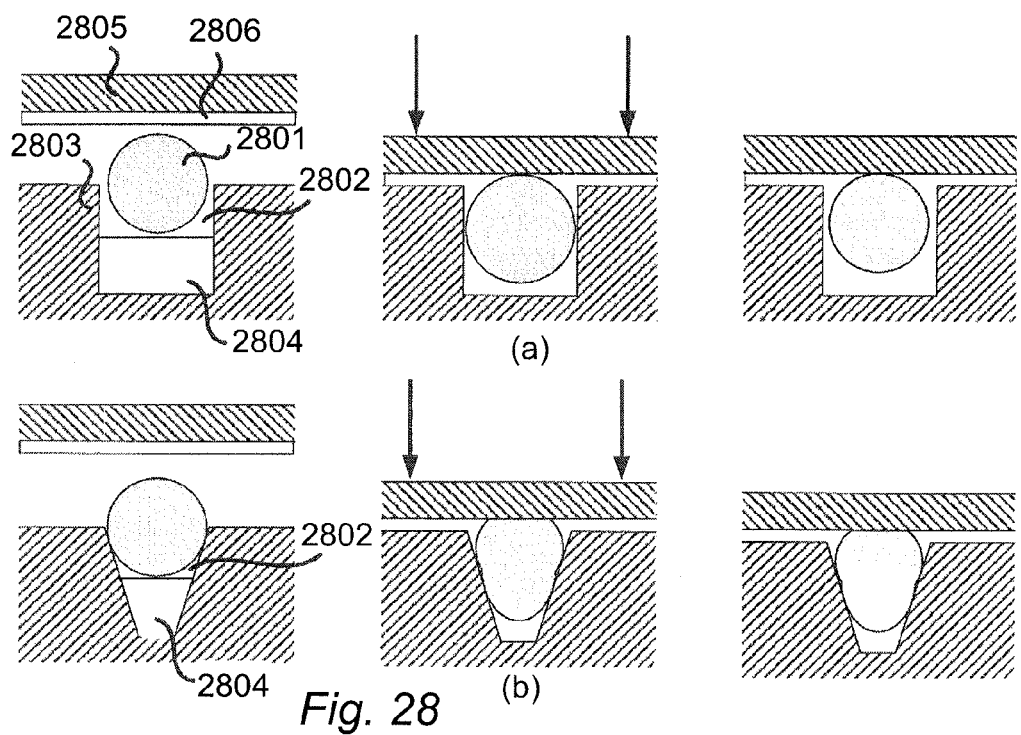
FIG. 28 is a schematic and simplified illustration of adhesive fixation of a SME wire in a straight (a) and v-shaped (b) trench with a second substrate as clamp support.
Figure 29:
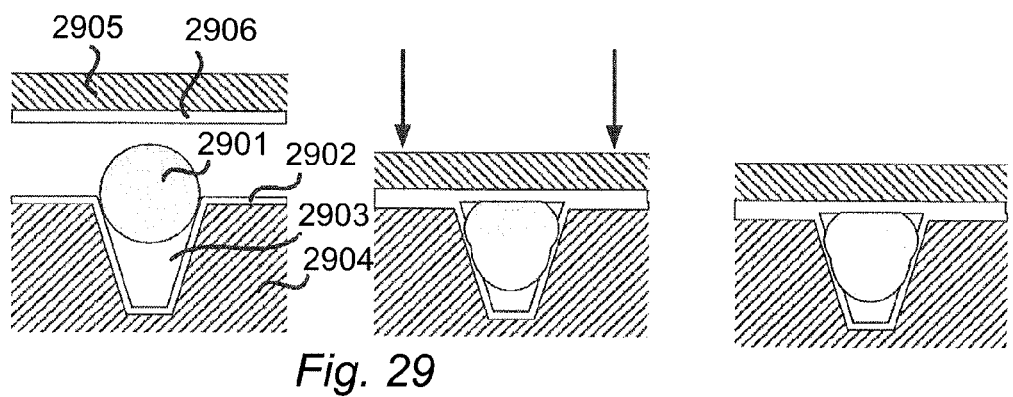
FIG. 29 is a schematic and simplified illustration of a squeeze fit structure with metal based bonding of a second substrate as clamp support.

The adhesive anchoring concept illustrated in FIGS. 26 and 27 can be combined with adhesive wafer bonding to support the clamping of the wire. FIG. 28 illustrates the concept, which is similar for both straight and V-shaped trenches. The SMA wire (2801) is placed above the trench/groove (2802, 2803) which is formed in the substrate (2804) and partially filled with adhesive (2804). The wire is squeezed into the adhesive in the trenches using a second substrate (2805) which is covered with adhesive (2806) and pressed onto the wire and the first substrate (2803). Then, all the adhesive is cured and the wire is anchored both by the adhesive and the second substrate on top. Such an approach is feasible also for the squeeze-fit with metal lined clamp structures. FIG. 29 illustrates the concept. The wire (2901) is placed above the metal lined (2902) trench (2903) in the first substrate (2904). The wire is squeezed into the metal lined trenches using a second substrate (2905) which is covered with metal (2906) and pressed onto the wire and the first substrate (2904). Then, the second substrate is bonded with its metal to the metal on the first substrate. Thereby, the SMA can be electrically contacted via the metal film and the clamping is supported by the bonded second substrate.

Figure 30:
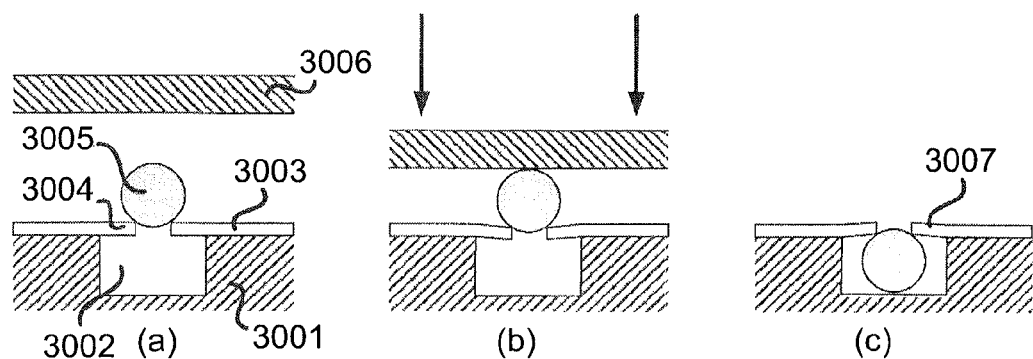
FIG. 30 is a schematic and simplified illustration of a snap fixation of a wire.

Similar to the concepts illustrated in FIGS. 17 and 18, a snap-in structure can be fabricated to snap the wire in to. FIG. 30 schematically illustrates this concept. In the substrate (3001), a trench (3002) is formed and on top of the substrate a thinner layer (3003) is formed which partially covers the trench but has an opening in the center of the trench, thereby creating snap-in structures (3004). The SMA wire (3005) is placed above the snap-in structures (FIG. 30*a*). The wire is squeezed through the opening of the top layer into the trench in the substrate using a piston (3006), which for example could be a second substrate which is pressed onto the wire and the second substrate in a wafer bonder (FIG. 30*b*). The top layer snaps back (3007) and holds the wire in place (FIG. 30*c*).

Figure 31:
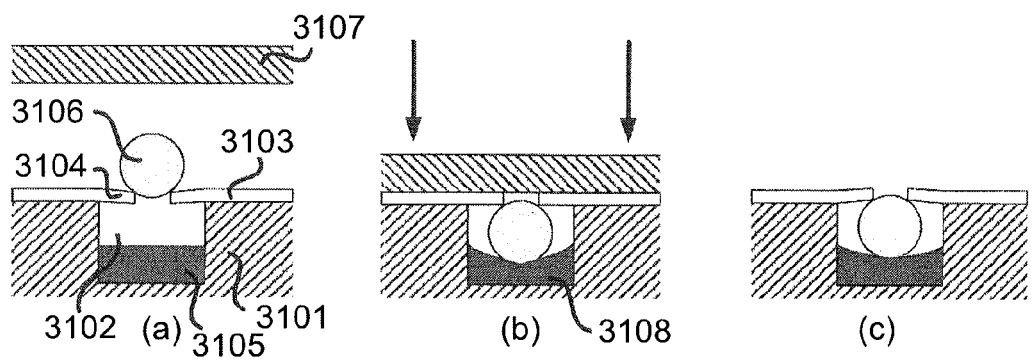
FIG. 31 is a schematic and simplified illustration of a snap fixation of a wire with a spring load.

A variation of the concept schematically illustrated in FIG. 30 is to provide a spring in the trench which presses the wire against the snap structures in the top layer. FIG. 31 schematically illustrates the concept. In the substrate (3101), a trench (3102) is formed and on top of the substrate a thinner layer (3103) is formed which partially covers the trench but has an opening in the center of the trench, thereby creating snap-in structures (3104). In the bottom of the trench a layer (3105) is formed which is elastically deformable (FIG. 31*a*). After squeezing the wire (3106) with the piston (3107) through the snap-in structures, the wire compresses the deformable layer (3108) (FIG. 31*b*). When removing the piston, the elastically deformed layer presses the wire into the snap-in structures, which are strong enough to withstand the forces generated by the elastically deformed layer (FIG. 31*c*).

Figure 32:
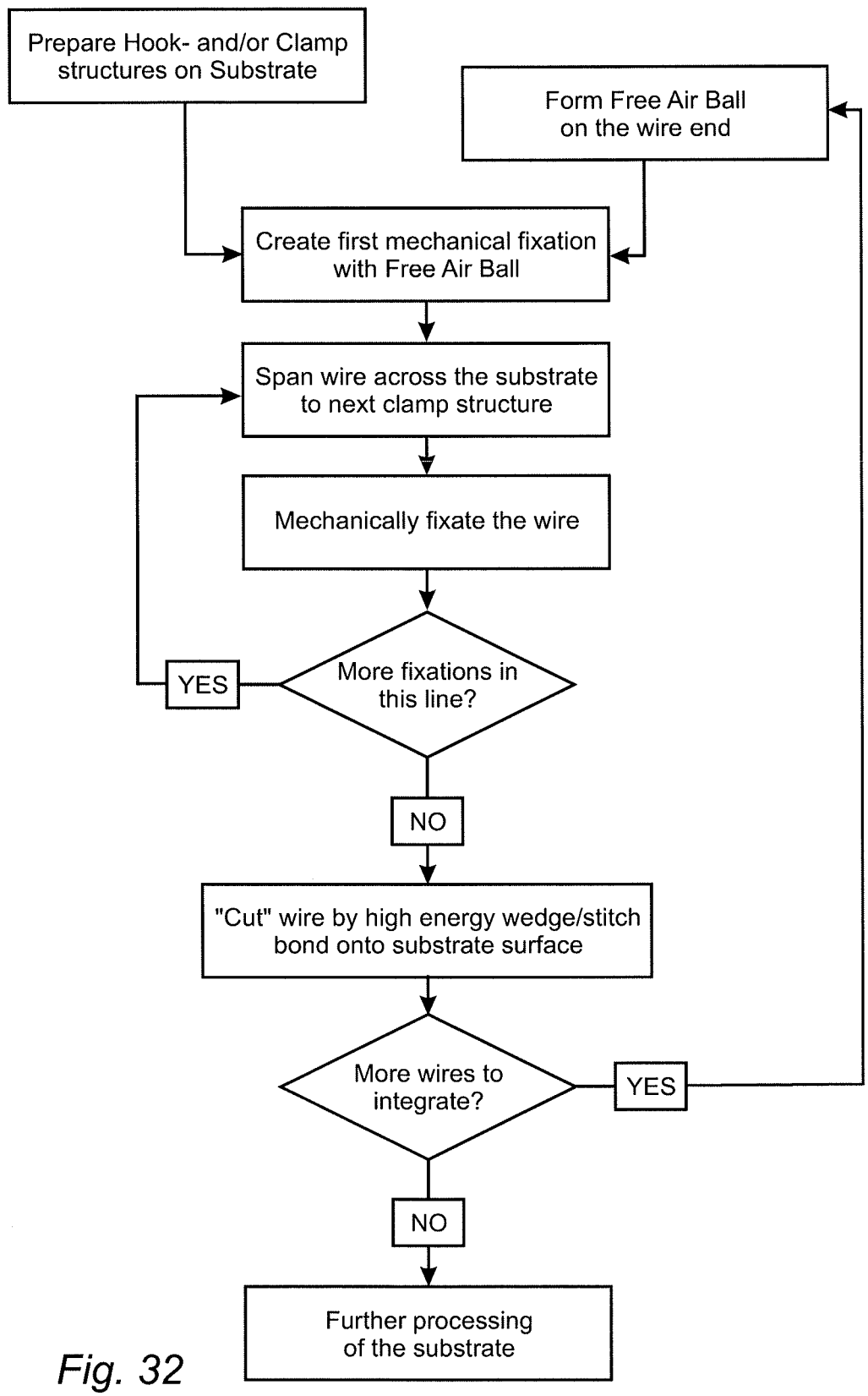
FIG. 32 is a process scheme for the integration of SMA wires using a wire bonder.
Figure 33:
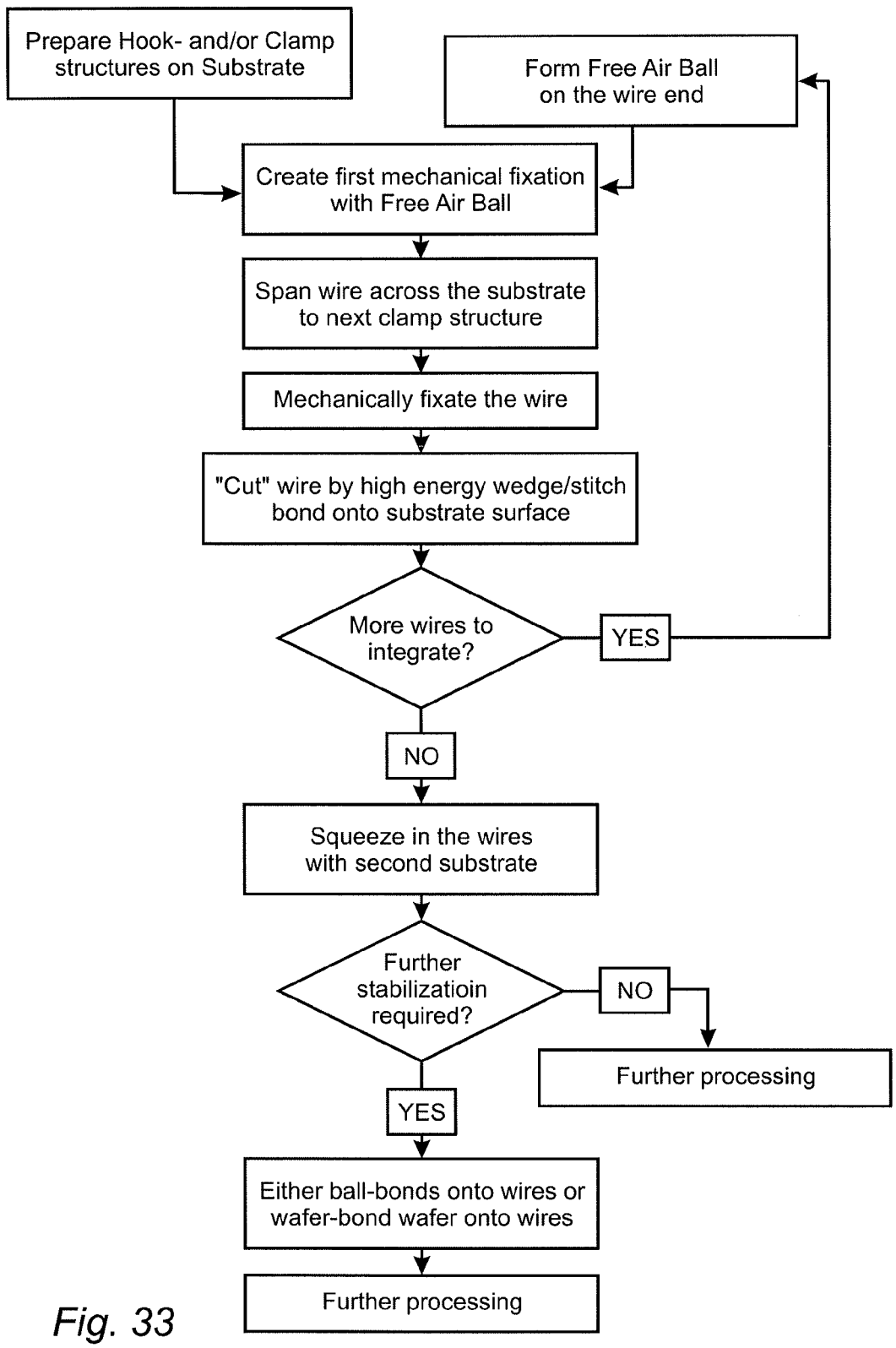
FIG. 33 is a process scheme for the integration of SMA wires using a wire bonder and squeeze in of wires with piston.

FIGS. 32 and 33 show process schemes for the integration of SMA wires using a wire-bonder. The flow in FIG. 32 illustrates a process where the first fixation is provided by anchoring the Free Air Ball. Then, all the following fixations required are performed by clamping the wire with the wire-bonder into clamping structures. After the last clamping structure in one line, the wire is cut off by a high energy wedge/stitch bond onto the substrate surface. If necessary, these steps can be repeated to integrate more wires. If not, the wire is integrated and can be further processed.

The flow in FIG. 33 illustrates a process where the first fixation is provided by anchoring the Free Air Ball. Then, the wire is spanned over all the clamping structures in the line and finally the wire is cut off by a high energy wedge/stitch bond onto the substrate surface. If necessary, these steps can be repeated to place more wires. If all wires are in place, they are squeezed into the underlying clamping structures using a piston. If the clamping is strong enough, the substrate can be further processed. If not, additional ball bonds can be placed on the wire in the clamp structures or during the squeezing a second substrate can be bonded onto the wires and the first substrate.

It will be understood that the invention is not restricted to the aforedescribed and illustrated exemplifying embodiments thereof and that modifications can be made within the scope of the invention as defined by the accompanying Claims.

The invention claimed is:

1. A method of attaching a wire to a substrate, wherein said wire is mechanically attached into a 3D structure, being a part of said substrate, comprising at least one clamp structure and further comprising the steps of:
fixating said wire either by generating frictional forces or anchoring between a portion of said wire and said 3D structure; and
truncating said wire by applying a force.

2. The method according to claim 1, wherein said wire is mechanically attached to an anchor structure at a first attachment point by anchoring and to at least one clamp structure at a second attachment point by generating frictional forces between said wire and said 3D structure on said substrate.

3. The method according to claim 1, wherein said wire and/or said clamp structure are deformable.

4. The method according to claim 2, wherein the method further comprises the steps of:
generating a free air ball at one end of said wire by an electrical discharge, while using a wire bonder, to be anchored by said anchor structure; and
guiding the other end of said wire to said clamp structure to be clamped in between at least a pair of cantilevers of said clamp structure.

5. The method according to claim 1, wherein said wire is truncated by a bond capillary of a wire bonder and a bond force.

6. The method according to claim 2, wherein anchoring involves hooking in, squeezing-fit or fixating said portion of wire in said 3D structure.

7. The method according to claim 4, wherein said free air ball is squeezed-fit into deformable structures being a part of said 3D structure.

8. The method according to claim 4, wherein said free air ball is squeezed-fit into said 3D structure formed as a V-groove.

9. The method according to claim 4, wherein said free air ball is squeezed-fit with a piston.

10. The method according to claim 4, wherein a metal film is deposited onto said 3D structure.

11. The method according to claim 7, wherein said free air ball, being squeezed-fit into said 3D structure, is bonded with another free air ball attached to one end of a wire which is thereby truncated.

12. The method according to claim 4, wherein said free air ball is fixated to said 3D structure by using adhesive.

13. The method according to claim 12, wherein said 3D structure is formed as a V-groove.

14. The method according to claim 4, wherein said 3D structure is a snap-in structure.

15. The method according to claim 14, wherein said snap-in structure comprises a spring load.

16. A wire bonder comprising a bond capillary for feeding a wire to be mechanically attached to a 3D structure which is a part of a substrate and comprises at least one clamp structure, and said wire bonder is adapted to perform the steps according to claim 1.

17. The method of claim 1, wherein the wire is a SMA-wire.

18. A device comprising a wire attached to a substrate, wherein said wire is configured to be mechanically attached to a 3D structure on said substrate, wherein said substrate comprises a fixation pair with at least one clamp structure, and wherein said wire is configured to be mechanically fixated to said substrate by at least said fixation pair and truncated by a bond capillary of a wire bonder and an applied force.

19. The device according to claim 18, wherein said wire is anchored to an anchor structure at a first attachment point and attached to at least one clamp structure at a second attachment point by frictional forces generated on said substrate.

20. The device according to claim 19, wherein said anchor structure is anchored at one end of said wire having a free air ball generated by an electrical discharge of a wire bonder and said clamp structure is clamped at the other end of said wire between at least a pair of cantilevers of said clamp structure.

* * * * *